United States Patent
Hanscombe

(10) Patent No.: US 9,786,828 B2
(45) Date of Patent: Oct. 10, 2017

(54) METHOD OF PRODUCING A THERMOCOUPLE HAVING A TAILORED THERMOELECTRIC RESPONSE

(71) Applicant: Weston Aerospace Limited, Farnborough, Hampshire (GB)

(72) Inventor: Paul Hanscombe, Farnborough (GB)

(73) Assignee: WESTON AEROSPACE LIMITED, Hampshire (GB)

( * ) Notice: Subject to any disclaimer, the term of this patent is extended or adjusted under 35 U.S.C. 154(b) by 552 days.

(21) Appl. No.: 14/185,339

(22) Filed: Feb. 20, 2014

(65) Prior Publication Data
US 2014/0238457 A1    Aug. 28, 2014

(30) Foreign Application Priority Data

Feb. 22, 2013 (GB) .................................. 1303189.3
May 1, 2013 (GB) .................................. 1307868.8

(51) Int. Cl.
*H01L 35/12* (2006.01)
*H01L 35/20* (2006.01)
(Continued)

(52) U.S. Cl.
CPC ............. *H01L 35/12* (2013.01); *G01K 7/02* (2013.01); *H01L 35/20* (2013.01); *H01L 35/34* (2013.01)

(58) Field of Classification Search
CPC ......... H01L 35/20; H01L 35/34; H01L 35/12; G01K 7/02
See application file for complete search history.

(56) References Cited

U.S. PATENT DOCUMENTS 1,468,456 A * 9/1923 Bristol .................... H01L 35/20
                                                      136/227
2,183,592 A * 12/1939 Silliman .................. C22C 9/00
                                                      420/469

(Continued)

FOREIGN PATENT DOCUMENTS

CN       85100658 A    8/1986
CN       1067962 A     1/1993
(Continued)

OTHER PUBLICATIONS

CN101561323 A Online Machine Translation as provided by Patent Translate-powered by EPO and Google, Translated on Aug. 22, 2016.*

(Continued)

*Primary Examiner* — Golam Mowla
(74) *Attorney, Agent, or Firm* — Fredrikson & Byron, P.A.

(57) ABSTRACT

A method is disclosed for tailoring the thermoelectric response of a thermocouple to that desired by a user. The method comprises the steps of; (a) selecting a first thermoelectric material, (b) selecting a second thermoelectric material having dissimilar thermoelectric properties to the first thermoelectric material, a thermocouple formed from the first thermoelectric material and the second thermoelectric material having a known thermoelectric response, and (c) modifying the chemical composition of at least one of the first thermoelectric material and the second thermoelectric material to produce a thermocouple having a tailored thermoelectric response. In specific embodiments, the chemical composition may be modified by selectively depleting one or more chemical elements from the thermoelectric material or by selectively adding, or increasing the proportion of, one or more elements to the thermoelectric material.

20 Claims, 4 Drawing Sheets

Figure 1:
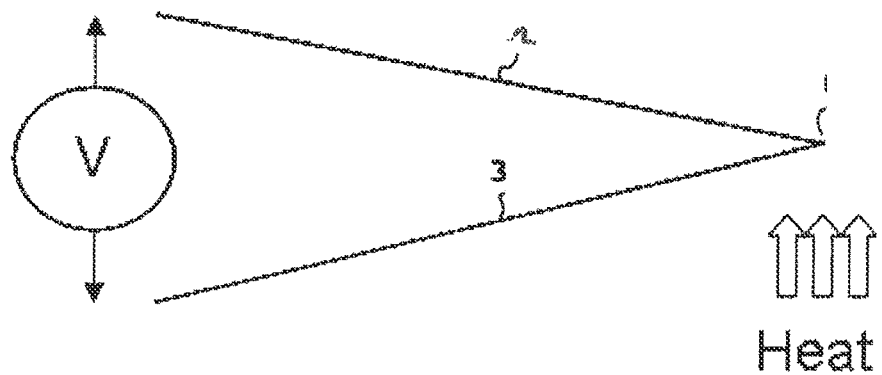

(51) Int. Cl.
*G01K 7/02* (2006.01)
*H01L 35/34* (2006.01)

(56) References Cited

U.S. PATENT DOCUMENTS

| | | | | |
|---|---|---|---|---|
| 2,466,202 A * | 4/1949 | Brenner | ............... | G01K 7/02 |
| | | | | 136/227 |
| 3,926,681 A | 12/1975 | Wang | | |
| 4,002,500 A * | 1/1977 | Wang | ............... | G01K 7/10 |
| | | | | 136/227 |
| 4,125,738 A * | 11/1978 | Nichols | ............... | G01K 7/04 |
| | | | | 136/233 |
| 4,936,690 A * | 6/1990 | Goetzinger | ............... | G01K 7/13 |
| | | | | 374/133 |
| 6,267,626 B1 * | 7/2001 | Hollander | ............... | H01R 13/719 |
| | | | | 374/E7.005 |
| 6,905,736 B1 | 6/2005 | Chow et al. | | |
| 7,084,342 B2 * | 8/2006 | Schuh | ............... | G01K 7/13 |
| | | | | 136/224 |
| 2005/0155640 A1 * | 7/2005 | Schuh | ............... | G01K 7/13 |
| | | | | 136/224 |

FOREIGN PATENT DOCUMENTS

| | | | |
|---|---|---|---|
| CN | 101561323 | A | 10/2009 |
| CN | 102130288 | A | 7/2011 |
| EP | 1376667 | A1 | 1/2004 |
| GB | 876533 | A | 9/1961 |
| GB | 876553 | A | 9/1961 |
| GB | 1082023 | A | 9/1967 |
| GB | 1178349 | A | 1/1970 |
| GB | 1243250 | A | 8/1971 |
| JP | 2003012327 | A | 1/2003 |
| WO | 2013069588 | A1 | 5/2013 |
| WO | 2014125292 | A1 | 8/2014 |

OTHER PUBLICATIONS

UK Search Report dated Aug. 18, 2013 for related Application No. GB 1303189.3, 2 pgs.
Pavlna, V.S. et al., "Analysis of the Kinetics of Sublimation of Alloying Elements in Alloys with Allowance for Chemical Reactions," Plenum Publishing Corporation, Jan. 1986, pp. 566-570.
Runnalls, O.J.C., "The Preparation of Plutonium-Aluminum and Other Plutonium Alloys," Atomic Energy of Canada Limited, Chalk River, Ontario, Jan. 1956.

* cited by examiner

METHOD OF PRODUCING A THERMOCOUPLE HAVING A TAILORED THERMOELECTRIC RESPONSE

The invention relates to a method of producing a thermocouple, and in particular to a method of tailoring the thermoelectric response of a thermocouple to that desired by a user.

BACKGROUND

To produce a thermoelectric output, two materials 2,3 with dissimilar thermoelectric properties are joined so that, when the junction 1 of the two materials is heated or cooled, a voltage may be measured across the two materials. This is illustrated schematically in FIG. 1. A thermocouple therefore consists of two separate materials, which are often referred to as the positive 2 and negative 3 legs. A common requirement for these materials is that they are in the form of wire or thin strip, in order to achieve the required thermoelectric output whilst using the minimum amount of material.

There are a number of standard thermoelectric materials that are commonly used as legs of standard types of thermocouples. The standard types, for example K-type or N-type, have well defined thermoelectric responses, and other properties such as corrosion resistance are also well understood. To produce thermocouples conforming to the standard types, which are defined by national and international specifications, alloys of typical compositions are selected for each leg. There is a natural variation in the composition and properties of alloys used to form these legs, and so, where higher accuracy thermocouples are required, several combinations may have to be considered before a suitable match is found. This requires a thermocouple manufacturer to have several batches or lots of each standard material available, to ensure a satisfactory selection can be achieved.

When selecting a thermocouple, a user will typically choose a standard thermocouple that most satisfactorily fulfils the user's required condition. Conditions may be directly related to the thermoelectric response, for example a user may require a thermocouple that will provide a certain thermoelectric response over a specified temperature range. Other conditions such as chemical resistance in a particular environment may also apply. Hence, in order to meet a required specification, a user typically forms a standard type of thermocouple by selecting positive and negative legs from a stock of alloy material.

Sometimes a user may require a thermocouple having a thermoelectric response that does not conveniently fall within the specification of a standard type of thermocouple, or within the specification of any combination of known thermoelectric materials. In some applications, for example, the thermocouple output may be required to be positive by a few degrees, placing it outside the normal tolerance band of standard types of thermocouples formed by typical manufacturing processes. Alternatively, a user may require a thermocouple to achieve a specific accuracy, but there may be a limited source of material available for selection of the thermocouple legs. Thus, there may not be suitable material available to form a thermocouple having the required output. In such cases it may be desirable to have a process which allows fine tuning or tailoring of the thermoelectric output of a thermocouple.

SUMMARY OF INVENTION

The invention provides a method of producing a thermocouple as defined in the appended independent claim, to which reference should now be made. Preferred or advantageous features of the invention are set out in various dependent sub-claims.

The invention may provide a method of tailoring or fine-tuning the thermoelectric properties of a thermoelectric material by modifying the composition of the thermoelectric material forming one, or both, of the thermocouple legs. This may be achieved in two ways, which are either increasing or reducing the concentration of one or more of the alloying elements in the thermoelectric material.

In one aspect the invention may provide a method of producing a thermocouple having a tailored thermoelectric response, comprising the steps of selecting a first thermoelectric material, selecting a second thermoelectric material having dissimilar thermoelectric properties to the first thermoelectric material, a thermocouple formed from the first thermoelectric material and the second thermoelectric material having a known thermoelectric response, and modifying the chemical composition of at least one of the first thermoelectric material and the second thermoelectric material to produce a thermocouple having the tailored thermoelectric response.

As used herein, the term 'tailored thermoelectric response' means that the thermoelectric response of the thermocouple has been altered to meet a specific requirement of the user. The first and second thermoelectric materials are preferably known, standard, thermoelectric materials, as typically used to form standard types of thermocouple. Either one, or both, of the first and second thermoelectric materials may be modified to provide the thermocouple having a tailored thermoelectric response.

The method may involve steps of modifying at least a portion of the first thermoelectric material to form a modified first thermoelectric material and/or modifying the chemical composition of at least a portion of the second thermoelectric material to form a modified second thermoelectric material, such that a thermocouple formed by joining the modified first thermoelectric material and the second thermoelectric material, or the first thermoelectric material and the modified second thermoelectric material, or the modified first thermoelectric material and the modified second thermoelectric material, provides the tailored thermoelectric response. If only a portion of the first and/or second thermoelectric material is modified, it is important that the modified portion is the portion that is in the temperature gradient generating the thermoelectric voltage.

The step of modifying the first thermoelectric material and/or the second thermoelectric material may occur prior to a step of joining the two thermoelectric materials to form the thermocouple having a tailored thermoelectric response. That is, either one, or both, of the legs forming the thermocouple may be modified and then joined to form the thermocouple.

The first and second thermoelectric materials may be joined to form a thermocouple having a known thermoelectric response, and then subsequently the chemical composition of both the first and second thermoelectric materials are modified to form the thermocouple having a tailored thermoelectric response. Thus a standard type of thermocouple may be constructed, for example a K-type thermocouple, and then the chemical composition may be modified to provide a tailored thermoelectric response.

Advantageously, modification of the chemical composition of at least one of the first thermoelectric material and the second thermoelectric material may be achieved by selectively depleting one or more elements from the material to alter its thermoelectric properties. Selective depletion results in the concentration of one or more alloying elements of the material being reduced.

Reducing the concentration of one or more of the alloying elements may be advantageously achieved by sublimation. Selective depletion may be achieved by heating the first thermoelectric material and/or the second thermoelectric material to a predetermined temperature in a controlled environment to deplete one or more elements from the material by a process of sublimation. For example, the material may be held at a high enough temperature to increase the vapour pressure of the selected element, and the surface of the material may be exposed to reduced pressure, such as a vacuum, or a flow of clean fresh gas, resulting in the removal of the vapour. Preferential or selective removal of one of the elements may be achieved if the vapour pressure of the selected element is substantially different to that of the remaining elements.

Modification of the chemical composition of at least one of the first thermoelectric material and the second thermoelectric material may be alternatively achieved by selectively adding one or more elements to the material, or selectively increasing the proportion of one or more elements in the material, to alter its thermoelectric properties. In other words, an element that was not previously present in the thermoelectric material may be added in order to modify the thermoelectric properties. Alternatively, or in addition, the concentration of an element previously present in the material may be increased in order to modify the thermoelectric properties.

Adding, or increasing the concentration of, one or more elements may be achieved by several methods such as vacuum deposition processes including ion implantation, sputter deposition, and physical vapour deposition; by chemical vapour deposition, or by plating. An addition process may then be followed by a diffusion process to alloy the elements into the material. For example, adding, or increasing the concentration of, one or more elements may be achieved by placing the surface of a thermoelectric material in contact with a second material, such as by immersing in a powder or by coating the surface with a paint or varnish, and then heating the materials to promote diffusion of the one or more elements into the thermoelectric material. Thus, the thermoelectric material may be annealed so that any elements added to the material diffuse into the bulk of the material. A paint or varnish may be loaded with a powder consisting of or comprising the second material as a convenient method of bringing the thermoelectric material into contact with the second material prior to a thermal treatment to allow the second material to diffuse into the thermoelectric material.

Modifying the chemical composition may be achieved by selectively depleting one or more elements from the material and selectively adding, or selectively increasing the proportion of, one or more other elements in the material.

Whether the chemical composition is modified by depletion of elements or addition of elements, it is preferred that the thermoelectric material is modified in the solid state.

Advantageously, the first thermoelectric material and the second thermoelectric material may, if joined in the unmodified state, form a standard thermocouple. Modification of the chemical composition of one or both of first and second thermoelectric materials allows the thermoelectric properties of the resulting thermocouple to be tailored to a specific requirement outside that scope of properties provided by the standard thermocouple. For example, the first thermoelectric material and the second thermoelectric material may, if joined in the unmodified state, form a standard thermocouple of any of the following standard types; B-type, C-type, E-type, J-type, K-type, M-type, N-type, R-type, S-type, and T-type.

Either the first or the second thermoelectric material may be a standard thermoelectric alloy or material as used in standard types of thermocouple. Thus, the first and/or second thermoelectric material may be, in the unmodified state, platinum, platinum 30% rhodium, platinum 13% rhodium, platinum 10% rhodium, platinum 6% rhodium, tungsten 5% rhenium, tungsten 26% rhenium, chromel (approximately 90 wt % Ni and 10 wt % Cr), constantan (approximately 55 wt % Cu and 45 wt % Ni), iron, alumel (approximately 95 wt % Ni, 2 wt % Mn, 2 wt % Al, and 1 wt % Si), nisil (approximately 95.4 wt % Ni and 4.4 wt % Si), nicrosil (approximately 84.1 wt % Ni, 14.4 wt % Cr, 1.4 wt % Si, and 0.1 wt % Mn), and copper.

The alloys identified above will further include small quantities of other elements, or trace elements, which will be present within defined proportions.

It is preferred that the first and/or second thermoelectric material is in the form of a wire or ribbon prior to modification. Thus, modification may take place on pre-existing stock of thermoelectric material for the formation of a thermocouple.

The invention may also provide a tailored or bespoke thermocouple having a tailored thermoelectric response, the thermocouple being formed in accordance with any method described above, or using any material modified as described above.

SPECIFIC EMBODIMENTS OF THE INVENTION

Figure 2:
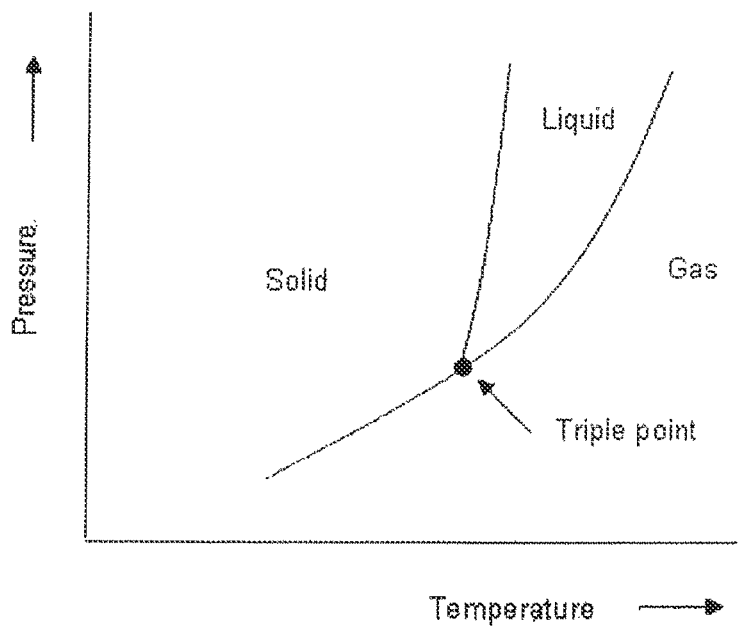
Figure 3:
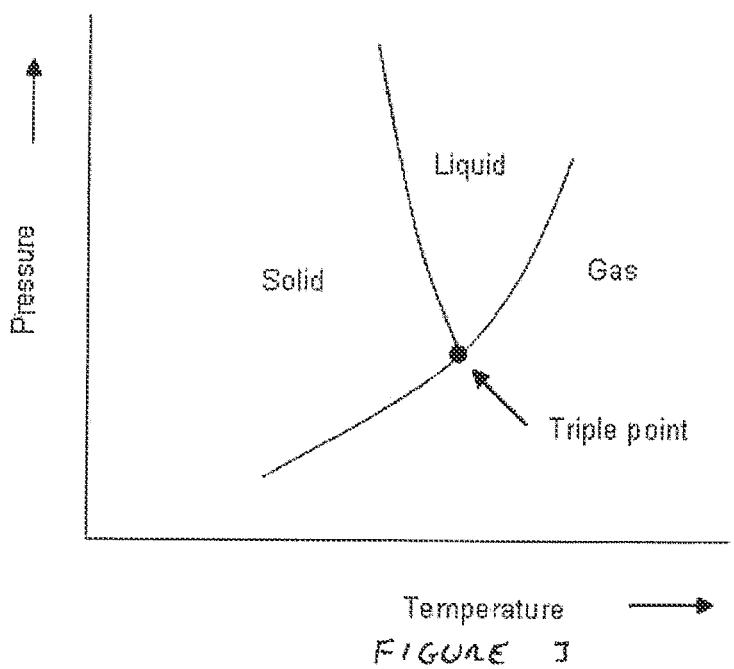
Figure 4:
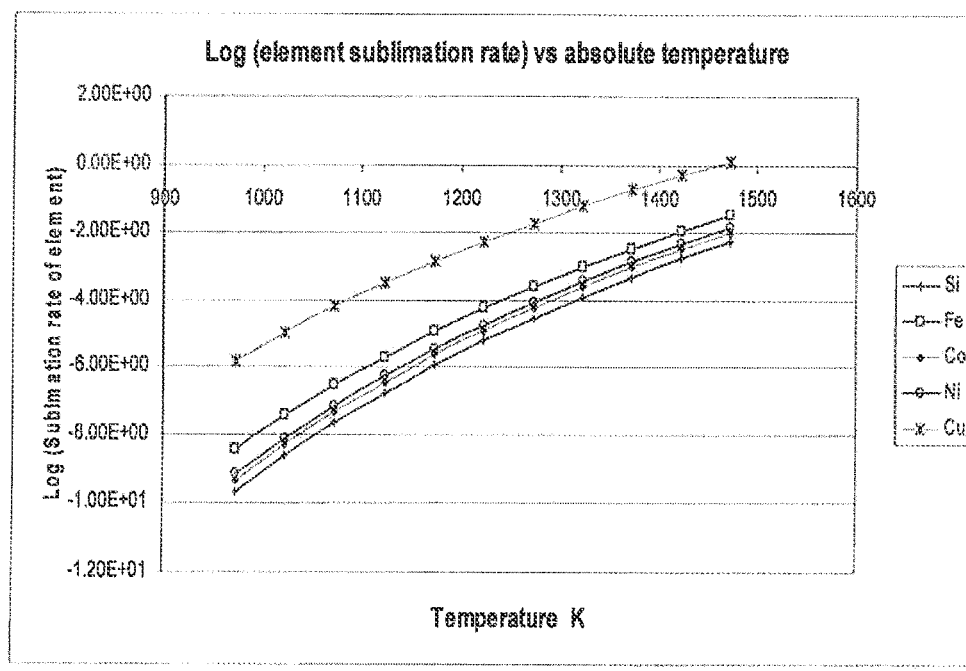
Figure 5:
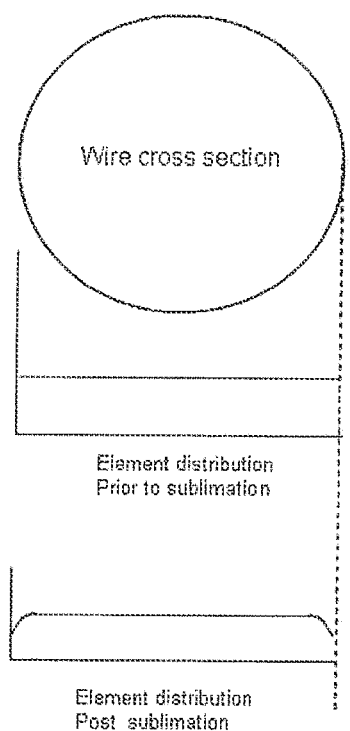
Figure 6:
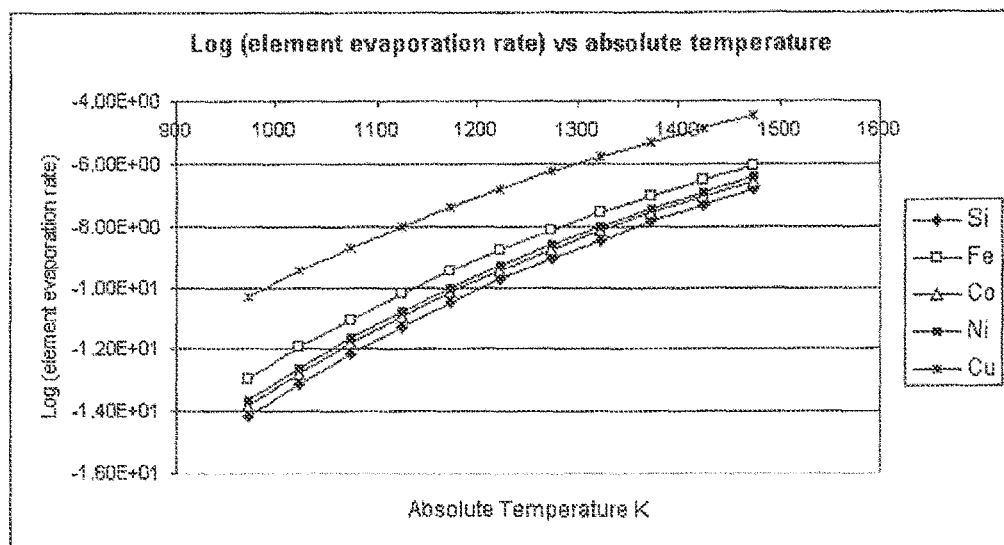
Figure 7:
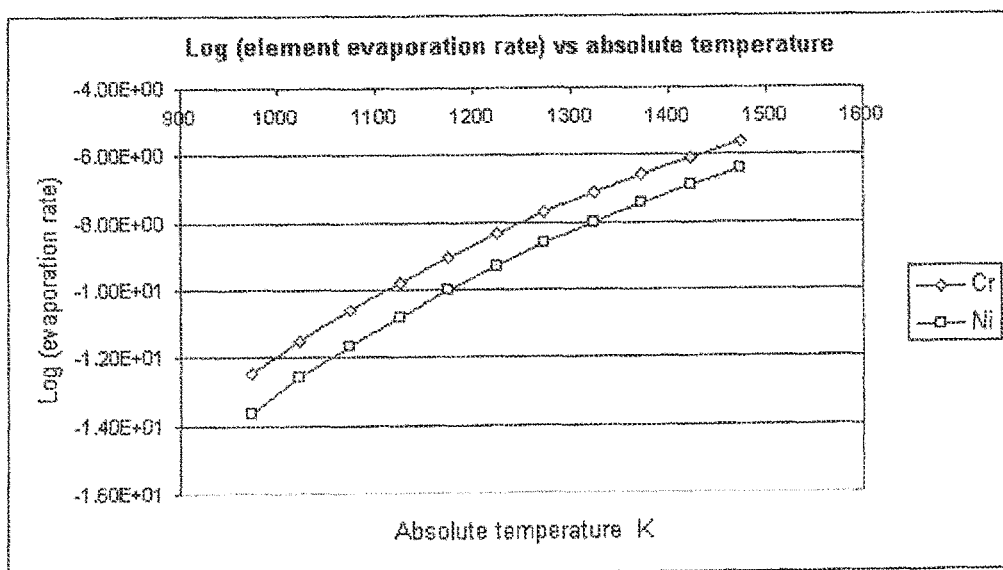

Specific embodiments of the invention will now be described with reference to the figures, in which:

FIG. 1 is a schematic diagram illustrating the operation of a thermocouple,

FIG. 2 is a pressure-temperature diagram for a material that contracts when temperature decreases below the triple point, FIG. 3 is a pressure-temperature diagram for a material that expands when temperature decreases below the triple point, FIG. 4 is a diagram that shows the effect of temperature on sublimation rates of different alloying elements in a first specific alloy, FIG. 5 is a schematic diagram that illustrates cross-sectional distributing of an alloying element in a thermocouple wire both before and after a sublimation process, FIG. 6 is a diagram that shows the effect of temperature on sublimation rates of different alloying elements in a second specific alloy, and FIG. 7 is a diagram that shows the effect of temperature on sublimation rates of different alloying elements in a third specific alloy.

In a first specific embodiment, a thermocouple having a tailored thermoelectric response is produced by selectively depleting elements from a known thermoelectric material in order to modify the thermoelectric properties of the material.

The general principle of the method is to selectively reduce the concentration of one of the elements within an alloy to change the thermoelectric properties of the alloy. The preferred process of selective reduction is to submit the material to a high temperature under vacuum, where the partial pressure of the selected element becomes significant, resulting in sublimation of the selected element. The amount of depletion of the selected element will be dependent on both time and temperature, and may be controlled by adjusting the partial pressure within the vacuum chamber. The concentration profile of the element within the thermoelectric material will be dependent on the diffusion rate.

The principle of selective depletion of an element is based upon alloy refinement using sublimation to selectively change the alloy composition, without reforming or melting the alloy. Sublimation is the direct transfer of material from a solid to a gas. This process may be visualised by considering the pressure-temperature diagram of a material at the triple point (see for example FIGS. 2 and 3). When the pressure is below the triple point, material may pass directly from a solid to a gaseous phase without passing through a liquid phase. Hence, if the saturated vapour pressure is removed from the surface by a vacuum or by an inert gas flow then material loss will occur with the rate being dependent on temperature.

FIG. 2 illustrates a pressure-temperature diagram in which the solid contracts when temperature decreases below the triple point. FIG. 3 illustrates a pressure-temperature diagram in which the solid expands when the temperature decreases below the triple point.

This process of material going directly from a solid into a gas was discussed by Langmuir under vacuum conditions, and is commonly discussed under the Langmuir equation. A form is shown below for the weight loss per unit area from a surface into a vacuum:

$$W = p\sqrt{\frac{M}{2\pi N_A kT}}$$

where p is the saturated vapour pressure of the material. M is the molecular weight of the material. $N_A$ is Avogadro's number. K is Boltzman's constant and T is the absolute temperature.

The saturated vapour pressure of a material can be approximated by the equation below:

$$p = \exp\left(\frac{-A}{T} + B\right)$$

where A & B are constants and T is the absolute temperature. This type of equation may be derived from the Clausius-Clapeyron equation of:

$$\ln(p) = B - \frac{\Delta H}{RT}$$

where ΔH is the molar enthalpy of sublimation. This equation has been found to be satisfactory for some temperature ranges but has been replaced by the Antoine equation where there is a wide temperature range.

A form of the Antoine equation is shown below.

$$\ln(p) = A' - \frac{B'}{(T_c - C)'}$$

where $T_c$ is the temperature in degrees Centigrade and A', B' and C' are constants.

A substantial amount of experimental work has been undertaken to measure the vapour pressures and sublimation rates of different elements. An example is shown schematically in FIG. 4 where the relative weight loss per unit area for a set of elements has been calculated. This diagram infers that, if these elements were present in an alloy, that copper would be preferentially removed by taking the material to a high temperature under vacuum.

As sublimation starts there is a general loss of material from the surface of the alloy with elements being lost preferentially along certain crystallographic planes in a manner similar to that seen in chemical etches. Preferential loss will also occur at grain boundaries emphasising these edges as the bonding of the elements is weaker at these discontinuities. Loss of material at the grain boundary edges then becomes limited by the curvature of the surface and surface tension. Diffusion of the selected element through the material then becomes the dominant controlling mechanism, where the dominant diffusion path may be along the grain boundaries or through the bulk of the material dependent on the temperature. Thus, in an alloy the evaporation of a component element will be controlled by the pressure of the chamber, diffusion, and the vapour pressure of the element, where diffusion and vapour pressure will themselves be dependent on the temperature of the chamber.

FIG. 5 illustrates the effect of sublimation of an element on the distribution of that element over the cross-section of a wire. It can be seen that depletion at the surfaces of the wire is greater than in the bulk. The distribution of the element may be homogenised by a suitable annealing process.

The specific embodiment will now be discussed.

A thermoelectric material alloy, of the type used for the negative leg in N-type and K-type thermocouples, has composition similar to Silicon 2.8%, Iron 0.3%, Cobalt 1.5%, Copper 1.8% and Nickel 93.6%. It may be desired to produce a thermocouple using this standard alloy material, but tailor the thermoelectric output. In order to achieve this the wire forming the negative leg of the thermocouple may, prior to joining with the positive leg, be placed into a furnace under vacuum conditions. A processing temperature of 900 to 1350° C. may be used, at a pressure less than $10^{-3}$ torr for a predetermined period of time. The wire is then cooled in an inert dry atmosphere such as nitrogen or argon.

After the end of the processing time, the concentration of copper will no longer be constant across the wire diameter. This is due to preferential sublimation of copper at the surfaces of the wire. The wire may then be annealed by holding at temperature under an inert atmosphere at normal pressure, so that there is no further loss of copper, for long enough to homogenise the distribution of copper through the thickness of the wire.

The thermoelectric output of a thermocouple comprising the modified wire may be changed by about −0.3%. For example, if a 0.5 mm diameter wire made from an alloy having the composition Silicon 2.8%, Iron 0.3%, Cobalt 1.5%, Copper 1.8% and Nickel 93.6% is subjected to a vacuum of better than $10^{-4}$ torr at 1100° C. for 40 minutes, then copper sublimation takes place and the thermoelectric output decreases by about 0.3%.

In a further specific embodiment, a negative leg of a thermocouple having a nominal composition of 1.5% Aluminium, 2.5% Manganese, 2% Silicon, 0.5% Cobalt and 93.5% Nickel was subjected to a vacuum of better than $10^{-4}$ torr at 1100° C. for 40 minutes. During this treatment, manganese sublimation takes place thereby lowering the manganese content of the material. After treatment the thermoelectric output decreases by about 3%. A schematic diagram for the evaporation rate of these elements is shown in FIG. 6.

In order to drive the output of a pair of thermocouple materials in a positive direction, the same process could be applied to the positive leg of the thermocouple. By way of example, if a 90% Nickel, 9.9% Chrome, 0.1% Silicon composition were subjected to a vacuum of better than $10^{-4}$ torr at 1100° C. for 80 minutes then chromium sublimation would take place and the thermoelectric output would increase by about 1%. A schematic diagram for the evaporation rate of these elements is shown in FIG. 7.

The invention claimed is:

1. A method of producing a thermocouple having a tailored thermoelectric response, comprising the steps of:
   (a) selecting a first thermoelectric material;
   (b) selecting a second thermoelectric material having dissimilar thermoelectric properties to the first thermoelectric material, a thermocouple formed from the first thermoelectric material and the second thermoelectric material having a known thermoelectric response; and
   (c) modifying the chemical composition and thereby altering thermoelectric properties of at least one of the first thermoelectric material and the second thermoelectric material to produce the thermocouple having the tailored thermoelectric response,
      wherein modification of the chemical composition of at least one of the first thermoelectric material and the second thermoelectric material is achieved by selectively depleting one or more elements from the at least one of the first thermoelectric material and the second thermoelectric material to alter the thermoelectric properties, and
      wherein selective depletion is achieved by heating the first thermoelectric material and/or the second thermoelectric material to a predetermined temperature in a controlled environment to deplete one or more elements from the first thermoelectric material and/or the second thermoelectric material by a process of sublimation.

2. A method according to claim 1 comprising the steps of modifying at least a portion of the first thermoelectric material to form a modified first thermoelectric material, such that a thermocouple formed by joining the modified first thermoelectric material and the second thermoelectric material provides the tailored thermoelectric response.

3. A method according to claim 1 comprising the steps of modifying the chemical composition of at least a portion of the second thermoelectric material to form a modified second thermoelectric material, such that a thermocouple formed by joining the first thermoelectric material and the modified second thermoelectric material provides the tailored thermoelectric response.

4. A method according to claim 1 comprising the steps of modifying at least a portion of the first thermoelectric material to form a modified first thermoelectric material and modifying the chemical composition of at least a portion of the second thermoelectric material to form a modified second thermoelectric material, such that the thermocouple formed by joining the modified first thermoelectric material and the modified second thermoelectric material, provides the tailored thermoelectric response.

5. A method according to claim 1 in which the first thermoelectric materials are joined to form a thermocouple having a know the thermoelectric response, and then the chemical composition of both the first and second thermoelectric materials are modified to form the thermocouple having a tailored thermoelectric response.

6. A method according to claim 1 in which the sublimation is performed at reduced pressure or in a vacuum.

7. A method according to claim 6 in which the sublimation is performed under a gas flow.

8. A method of producing a thermocouple having a tailored thermoelectric response, comprising the steps of:
   (a) selecting a first thermoelectric material;
   (b) selecting a second thermoelectric material having dissimilar thermoelectric properties to the first thermoelectric material, a thermocouple formed from the first thermoelectric material and the second thermoelectric material having a known thermoelectric response; and
   (c) modifying the chemical composition of at least one of the first thermoelectric material and the second thermoelectric material to produce a thermocouple having the tailored thermoelectric response,
      in which said modifying the chemical composition of at least one of the first thermoelectric material and the second thermoelectric material is achieved by heating said at least one of the first thermoelectric material and the second thermoelectric material to a predetermined temperature in a controlled environment to selectively deplete one or more elements from the at least one of the first thermoelectric material and the second thermoelectric material by a process of sublimation to alter its thermoelectric properties.

9. A method according to claim 1 in which modification of the chemical composition of at least one of the first thermoelectric material and the second thermoelectric material is achieved by further selectively adding one or more other elements to the material to alter its thermoelectric properties.

10. A method according to claim 9 in which the selective addition is carried out by a materials addition process such as ion implantation, sputtering, plasma vapour deposition, chemical vapour deposition or plating.

11. A method according to claim 1 in which modification of the chemical composition of a least one of the first thermoelectric material and the second thermoelectric material is achieved by further selectively increasing the proportion of one or more other elements in the material to alter its thermoelectric properties.

12. A method according to claim 11 in which the selective increase in proportion is carried out by a materials addition process such as ion implantation, sputtering, plasma vapour deposition, chemical vapour deposition or plating.

13. A method according to claim 1 in which the first thermoelectric material and the second thermoelectric material form, in the unmodified state, a standard thermocouple.

14. A method according to claim 13 in which the standard thermocouple is a thermocouple selected from the list consisting of B-type, C-type, E-type, J-type, K-type, M-type, N-type, R-type, S-type, and T-type.

15. A method according to claim 1 in which either the first thermoelectric material or the second thermoelectric material, prior to modification, is a material selected from the list consisting of platinum, platinum 30% rhodium, platinum 13% rhodium, platinum 10% rhodium, platinum 6% rhodium, tungsten 5% rhenium, tungsten 26% rhenium, chromel, constantan, iron, alumel, nisill, nicrosil, and copper.

16. A method according to claim 1 in which the first and second thermoelectric materials are, prior to modification, in the form of wires.

17. A thermocouple having a tailored thermoelectric response said thermocouple being formed by a method according to claim 1.

18. A method according to claim 1 in which the predetermined temperature is between 900°C. and 1350°C.

19. A method according to claim 6 in which the reduced pressure is less than $10^{-3}$ torr.

20. A method according to claim 1 in which the step of selective depletion is followed by a step of annealing the at least one of the first thermoelectric material and the second thermoelectric material by holding the at least one of the first thermoelectric material and the second thermoelectric material at temperature under an inert atmosphere at normal pressure. materials are, prior to modification, in the form of wires.

\* \* \* \* \*

UNITED STATES PATENT AND TRADEMARK OFFICE
CERTIFICATE OF CORRECTION

PATENT NO. : 9,786,828 B2
APPLICATION NO. : 14/185339
DATED : October 10, 2017
INVENTOR(S) : Paul Hanscombe Page 1 of 1

It is certified that error appears in the above-identified patent and that said Letters Patent is hereby corrected as shown below:

In the Claims

Claim 5, Column 7, Line 64, after "first" insert -- and second --

Claim 20, Column 9, Lines 14-15, delete "materials are, prior to modification, in the form of wires."

Signed and Sealed this
Third Day of July, 2018

Andrei Iancu
*Director of the United States Patent and Trademark Office*